United States Patent

Kilby

[15] 3,643,138

[45] Feb. 15, 1972

[54] SEMICONDUCTOR DEVICE

[72] Inventor: Jack St. Clair Kilby, Dallas, Tex.

[73] Assignee: Texas Instruments Incorporated, Dallas, Tex.

[22] Filed: Jan. 29, 1962

[21] Appl. No.: 169,557

Related U.S. Application Data

[63] Continuation-in-part of Ser. No. 791,602, Feb. 6, 1959, Pat. No. 3,138,743, and a continuation-in-part of 811,476, May 6, 1959, abandoned, and a continuation-in-part of 811,486, May 6, 1959, Pat. No. 3,138,744.

[52] U.S. Cl. ....... 317/235, 317/234, 317/101

[51] Int. Cl. ....... H01l 19/00

[58] Field of Search ....... 317/234, 235, 101, 231

[56] References Cited

UNITED STATES PATENTS

| | | | |
|---|---|---|---|
| 2,680,220 | 6/1954 | Starr et al. | 317/235 |
| 2,709,232 | 5/1955 | Thedieck | 317/235 |
| 2,792,538 | 5/1957 | Pfann | 317/235 |
| 2,796,562 | 6/1957 | Ellis et al. | 317/234 |
| 2,890,395 | 6/1959 | Lathrop et al. | 317/234 |
| 2,910,634 | 10/1959 | Rutz | 317/235 |
| 3,038,085 | 6/1962 | Wallmark et al. | 307/88.5 |

*Primary Examiner*—James D. Kallam
*Attorney*—James O. Dixon, Andrew M. Hassell, Robert C. Peterson and Stevens, Davis, Miller and Mosher

EXEMPLARY CLAIM

1. A semiconductor device comprising:
   a. a wafer of semiconductor material having two major faces;
   b. said wafer being so shaped as to define a plurality of regions within said wafer and adjacent to one of said major faces;
   c. at least some of said regions being electrically isolated within said wafer from others of said regions;
   d. said regions having at least one portion thereof extending to said one major face;
   e. at least some of said portions having selected locations on said one major face for electrical contact to said region;
   f. an insulating material on said one major face of the wafer excluding at least said selected locations;
   g. at least one electrically conductive area in contact with said insulating material and spaced from said wafer thereby;
   h. said electrically conductive area being disposed in cooperative relationship with respect to a selected one of said isolated regions so as to provide the electrical function of a discrete electrical circuit component; and
   i. a plurality of metallic interconnections providing electrically conductive paths between said selected locations on different ones of said regions and between another selected one of said locations and said electrically conductive area.

4 Claims, 33 Drawing Figures

INVENTOR
Jack S. Kilby
BY Stevens, Davis, Miller & Mosher
ATTORNEYS

INVENTOR
Jack S. Kilby

BY
Stevens, Davis, Miller & Mosher
ATTORNEYS

INVENTOR
Jack S. Kilby

BY
Stevens, Davis, Miller & Mosher
ATTORNEYS

INVENTOR

Jack S. Kilby

BY

Stevens, Davis, Miller & Mosher

ATTORNEYS

PATENTED FEB 15 1972 3,643,138

SHEET 05 OF 11

INVENTOR
Jack S. Kilby

BY
Stevens, Davis, Miller & Mosher
ATTORNEYS

INVENTOR
Jack S. Kilby

BY
Stevens, Davis, Miller & Mosher
ATTORNEYS

INVENTOR
Jack S. Kilby

BY
Stevens, Davis, Miller & Mosher
ATTORNEYS

INVENTOR
Jack S. Kilby

BY
Stevens, Davis, Miller & Mosher
ATTORNEYS

SINGLE DIFFUSION OVER ENTIRE SURFACE OF WAFER

SINGLE DIFFUSION IN SELECTED AREA OF WAFER

DOUBLE DIFFUSION OVER ENTIRE SURFACE OF WAFER

DOUBLE DIFFUSION IN SELECTED AREA OF WAFER

TRIPLE DIFFUSION IN SELECTED AREA OF WAFER

TRIPLE DIFFUSION OVER ENTIRE SURFACE OF WAFER

INVENTOR
Jack S. Kilby

BY
Stevens, Davis, Miller & Mosher
ATTORNEYS

INVENTOR
Jack S. Kilby

BY Stevens, Davis, Miller & Mosher
ATTORNEYS

INVENTOR

Jack S. Kilby

BY

Stevens, Davis, Miller & Mosher

ATTORNEYS

SEMICONDUCTOR DEVICE

This application is a continuation-in-part of my copending applications Ser. No. 791,602, filed Feb. 6, 1959, now Pat. No. 3,138,743, issued June 23, 1964, and Ser. Nos. 811,476 and 811,486, filed May 6, 1959 abandoned and U.S. Pat. No. 3,138,744 issued June 23, 1964.

This invention relates to miniature embodiments of electronic circuits and methods for fabricating same. More particularly, it relates to unique integrated electronic circuits fabricated from semiconductor materials.

In modern day electronic packaging, the need for small, light, self-contained modules or "building blocks" has become increasingly important. Thus, for example, with the advent of space vehicles, the need for small, light electronic devices has become critical, and there has been a continuing search for structure s which minimum size, weight and power consumption. The discovery of the transistor and other semiconductor devices constituted a major breakthrough in the field of circuit miniaturization, and electronic circuits employed in air and space craft almost exclusively utilize semiconductor devices as active operating elements.

As is well known to those familiar with the art of circuit miniaturization, various proposals have been advanced for reducing the size and weight of electronic equipment. In contemplating such proposals, it may be helpful to consider the meaning attributed to some of the terms and expressions hereinafter used.

As will be apparent to one skilled in the art, circuit components can be classified according to their circuit functions. Thus, circuit elements may be thought of as being active or passive in nature. According to "The Encyclopedic Dictionary of Electronics and Nuclear Engineering," edited by Sarbacher, and published by Prentice-Hall, active elements are those which in an impedance network act as current generators; whereas passive elements do not so act. Examples of active elements are photocells and transistors; examples of passive elements are resistors, capacitors and inductors. Diodes, while often employed as passive elements, may if suitably biased and energized, function in an active capacity. Varactor diodes and tunnel diodes are examples of diodes operating in an active capacity.

The term "circuit" (or "network") means two or more discrete circuit elements electrically connected together; and by "discrete circuit element" is meant a resistor, capacitor, inductor, diode, transistor or the like that is formed separately or purposely as distinguished from existence as a function incidentally, accidentally, or inherently as a part of some other circuit element, as, for example, every transistor may be said to exhibit some resistance and capacitance along with its transistor action.

Prior art proposals have included packaging techniques in which the passive elements of an electronic "building block" such as a counter, multivibrator, AND gate, OR gate, etc., are formed on a single supporting member such as an insulating substrate. By conventionally applying coatings to the substrate, the passive elements have been formed with a minimum utilization of space.

Although such techniques have obvious advantages, problems have arisen in attempting to employ them in forming semiconductor devices such as diodes and transistors, for conventional semiconductor materials do not readily lend themselves to the evaporation of coatings thereon or to painting or other methods heretofore employed for the deposit preparation of passive elements. Further, the deposit on other substrates, such as those of ceramic material, of semiconductor material in the form needed for the production of active elements such as transistors or diodes has not been feasible. In addition, manufacturing steps employed for forming some of the circuit components have not been compatible with those required for forming others. Consequently, it has been conventional to form passive electrical elements upon a substrate and then to connect a separately formed transistor or other semiconductor component to the substrate by solder or conducting cement. Although such techniques have resulted in the production of relatively small electronic packages, they have been accompanied by drawbacks which include vulnerability to damage resulting from breakage of connections; and further search has nevertheless continued for electronic structures which feature an even greater reduction in size and improvement in reliability.

With the objective of eliminating some of the circuitry of a conventional phase shift oscillator, some (but not all) of the components thereof have been shown as being formed in a unitary semiconductor body. Thus, in U.S. Pat. No. 2,816,228 granted Dec. 10, 1957, to Harwick Johnson, there is depicted an alloyed transistor formed in a section of semiconductor material adjacent one end of an elongated bar, and a plurality of spaced diodes formed in the remaining section, thereby constituting an integrated transistor and capacitive-resistive delay line. However, even though some of the elements required for a phase shift oscillator have been thus illustrated in a single semiconductor structure, there has been no proposal for the inclusion of the required inductor. Moreover, while the prior art has proposed the formation in one specific structure of a transistor, capacitors and resistors, the characteristics of the structure disclosed are such as to make inexpedient their general exploitation in the fabrication of unitary semiconductor embodiments of networks, circuits, etc.

Consequently, in an effort to further reduce cost and size, and to increase reliability and structural rigidity, the search has continued for an electronic packaged assembly in which: all of a variety of circuit components can be formed by compatible process steps in a unitary structure; interconnections of the components can be made within the unitary structure; the necessity for exterior interconnections are eliminated or greatly reduced.

In contrast to the approaches to miniaturization that have been made in the past, the present invention has resulted from a new and totally different concept for miniaturization. Radically departing from the teachings of the art, it is proposed by the invention that miniaturization can best be attained by use of as few materials and operations as possible. In accordance with the principles of the invention, the ultimate in circuit miniaturization is attained using only one material for all circuit elements and a limited number of compatible process steps for the production thereof.

The above is accomplished by the present invention by utilizing a body of semiconductor material exhibiting one type of conductivity, either N-type or P-type, and having formed therein a diffused region or regions of appropriate conductivity type to form a PN-junction between such region or regions and the semiconductor body or, as the case may be, between diffused regions. According to the principles of this invention, all components of an entire electronic circuit are fabricated within the body so characterized by adapting the novel techniques to be described in detail hereinafter. It is to be noted that all components of the circuit are integrated into the body of semiconductor material and constitute portions thereof.

In a more specific conception of the invention, all components of an electronic circuit are formed in or near one surface of a relatively thin semiconductor wafer characterized by a diffused PN-junction or junctions. Of importance to this invention is the concept of shaping. This shaping concept makes it possible in a circuit to obtain the necessary isolation between components and to define the components or, stated differently, to limit the area which is utilized for a given component. Shaping may be accomplished in a given circuit in one or more of several different ways. These various ways include actual removal of portions of the semiconductor material, specialized configurations of the semiconductor material such as long and narrow, L-shaped, U-shaped, etc., selective conversion of intrinsic semiconductor material by diffusion of impurities thereinto to provide low-resistivity paths for current flow, and selective conversion of semiconductor material of one conductivity type to conductivity of the opposite type wherein the PN-junction thereby formed acts as a barrier to current flow. In any event, the effect of shaping is to direct and/or confine paths for current flow, thus permitting the fabrication of circuits which could not otherwise be obtained in a single wafer of semiconductor material. As a result, the final circuit is arranged in essentially planar form. It is possible to shape the wafer during processing and to produce by diffusion the various circuit elements in a desired and proper relationship.

Although my proposal constitutes a major advance in the art of circuit miniaturization, there may arise occasions in which the values of resistance to be formed within bodies of semiconductor material lie outside the bounds of those easily obtained. In addition, since the resistivity of semiconductor material varies quite widely with temperature, there may arise occasions in which a need for resistor stability renders the utilization of circuits embodied in the form heretofore mentioned less attractive.

Thus, in accordance with one feature of the invention, an insulating coating is applied to a block of semiconductor material, and passive electrical elements, such as resistors and capacitors, are formed wholly atop such insulating layer, thus rendering them electrically independent of the semiconductor material.

Consequently, it is an object of this present invention to provide in a package of minimum size, electronic circuits which include not only active elements such as transistors or diodes but, in addition, passive elements of great electrical stability formed either entirely within the semiconductor wafer or atop an insulating coating applied to the semiconductor wafer or both.

In accordance with another feature of the invention, the block of semiconductor material is advantageously utilized not only as a support for passive elements which may be formed thereover, but, in addition, as material in which various semiconductor devices may be formed.

In accordance with still another feature of the invention, in embodiments in which both capacitors and resistors are employed, resistive coatings and the lowermost plate of the capacitor may be formed simultaneously, and the dielectric coating for the capacitor may be applied over the resistor areas as well, thereby advantageously exploiting the dielectric material in a dual purpose.

In accordance with still another feature of the invention, a thin layer of selected impurity may be diffused where desired into the surface of the semiconductor body, ohmic contacts may be suitably spaced apart thereon to produce the desired resistance therebetween, and the capacitance exhibited between the thin layer and the main body of semiconductive material may be advantageously exploited to produce a distributed resistance-capacitive element whose capacitance can be varied by varying an applied electrical potential.

It is another general object of this invention to simplify manufacturing processes for producing such an electronic package, thereby further reducing cost.

In accordance with one feature of this invention, an extremely small and thin semiconductor body is employed as a single member wherein all of the required plurality of different circuit elements are formed, thereby minimizing the size of the completed package.

In accordance with another feature of the invention, all of the various elements are formed in the unitary body by a combination of impurity diffusion, masking and shaping.

In accordance with yet another feature of the invention, the combined diffusion, masking and shaping is advantageously employed to produce any parameter value within a wide range of suitable values, thus rendering practicable the exploitation of solid state semiconductor networks.

In accordance with yet a further feature of the invention, elements which are contiguous within the unitary body are effectively isolated through the advantageous employment of electrical and physical shaping, as hereinafter more fully described.

It is a further object of this invention to provide a miniature semiconductor gated multivibrator circuit fabricated from a single body of semiconductor material containing a plurality of diffused PN-junctions wherein all components of the diode gate are fabricated completely within the original body of semiconductor material, portions of the body being isolated from one another to prevent interference between different circuit elements.

These and other objects and features of the invention will be apparent from the following detailed description, by way of example, with reference of the drawing in which:

FIG. 1 illustrates pictorially a multivibrator circuit fabricated in accordance with the present invention;

FIG. 1*a* shows the schematic diagram for the multivibrator circuit of FIG. 1 laid out in the same relationship;

FIG. 1*b* illustrates the schematic diagram of the multivibrator circuit of FIG. 1 in a more conventional presentation;

FIG. 2 is a view in section taken along line 2—2 of FIG. 1;

FIG. 2*a* is an enlarged fragmentary view in section similar to FIG. 2 illustrating a variation;

FIG. 3 is a view in section taken along line 3—3 of FIG. 1;

FIG. 3*a* is an enlarged fragmentary view in section similar to FIG. 3 showing a variation;

FIG. 3*b* is an enlarged fragmentary view in section similar to FIG. 3 showing another variation;

Figure 8:
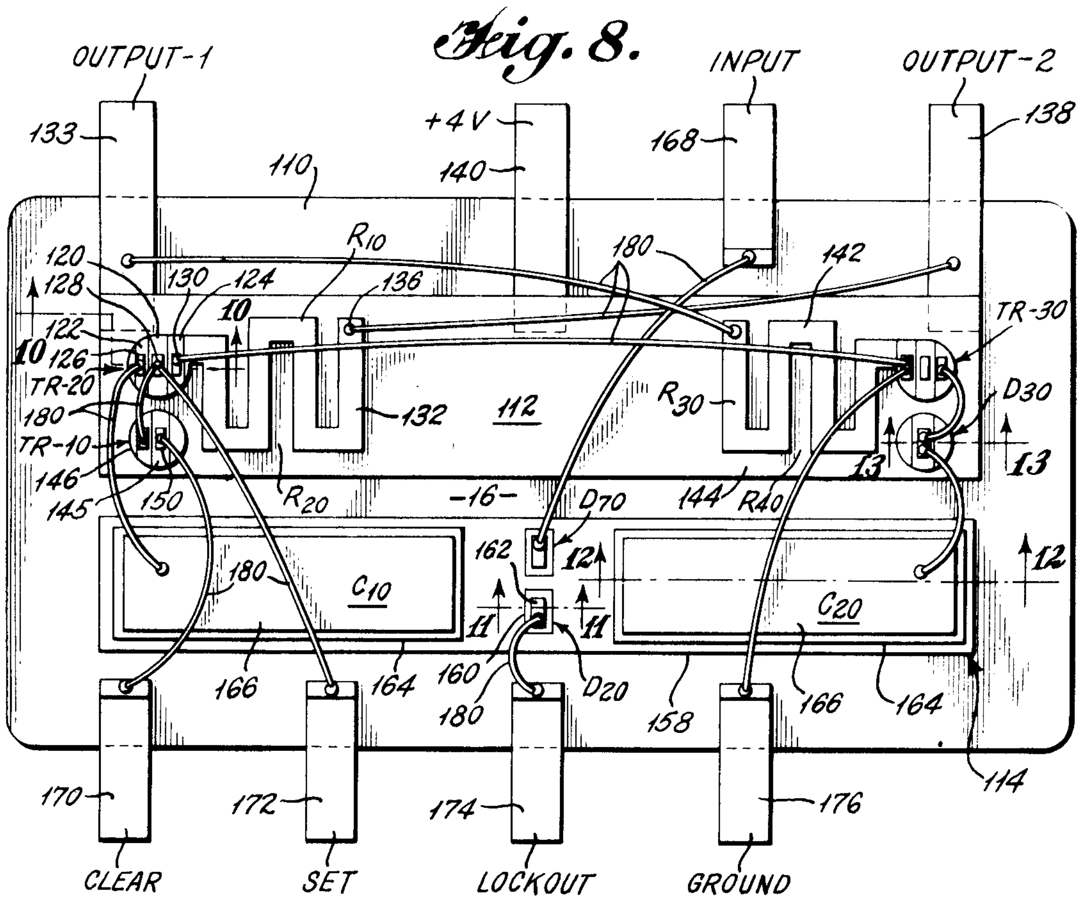
FIG. 8 illustrates a top plan view of a miniature semiconductor network gated bistable multivibrator embodying this invention.
Figure 8A:
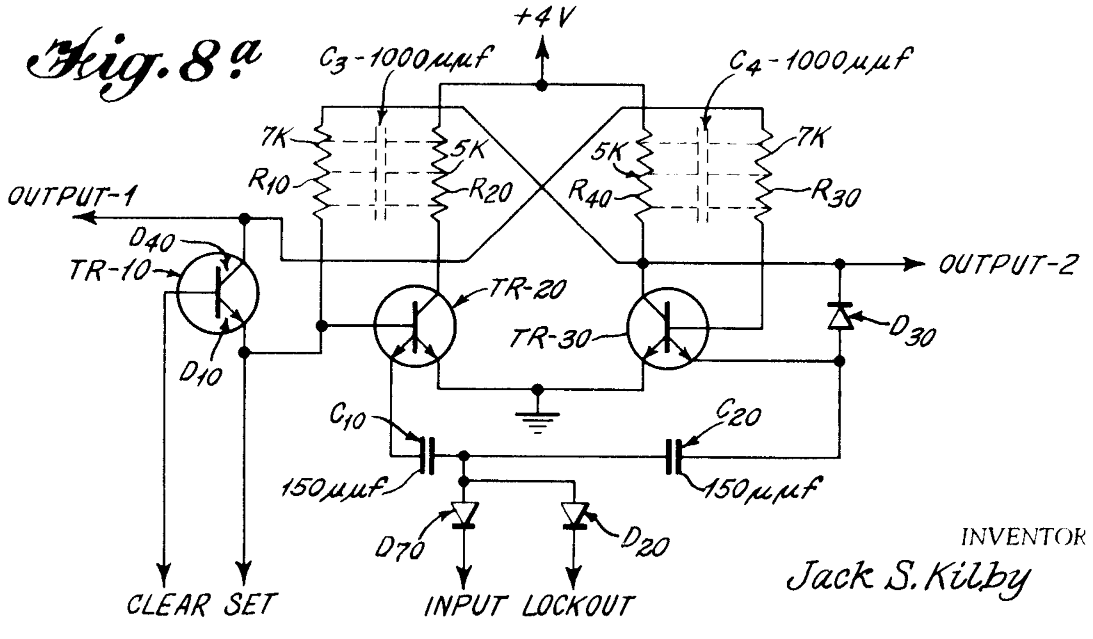
Figure 9:
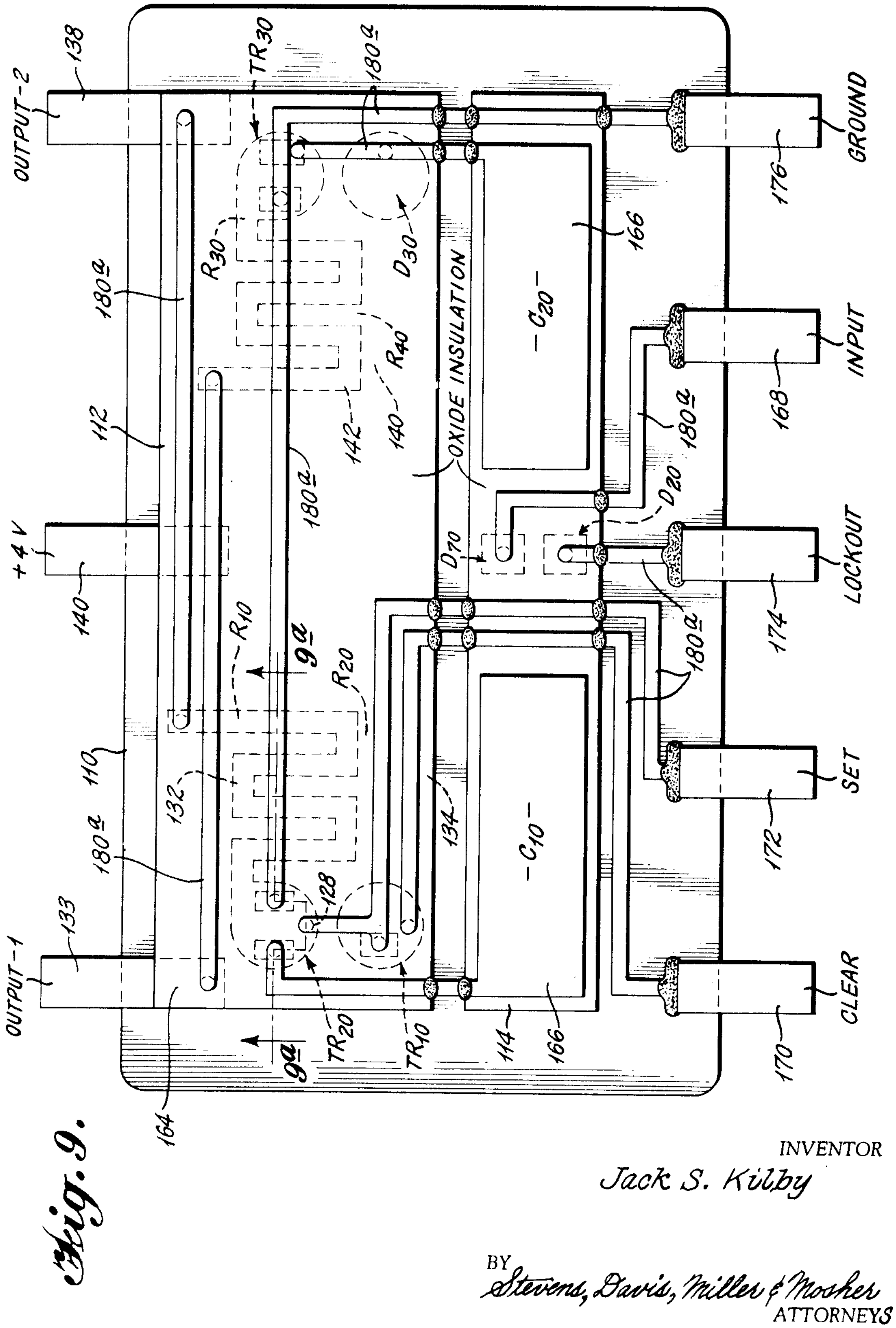
Figure 9A:
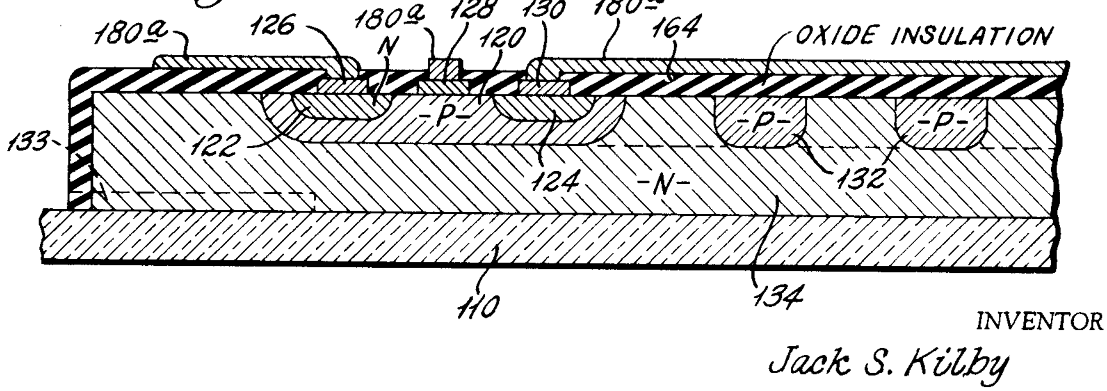
Figure 14:
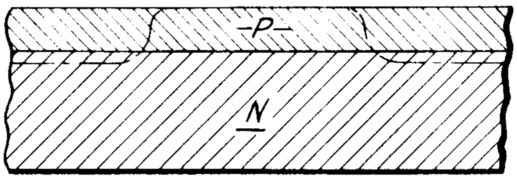
Figure 15:
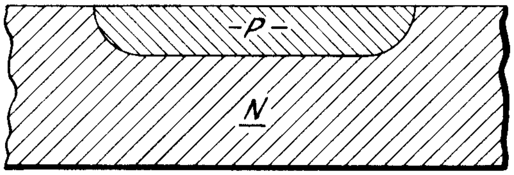
Figure 16:
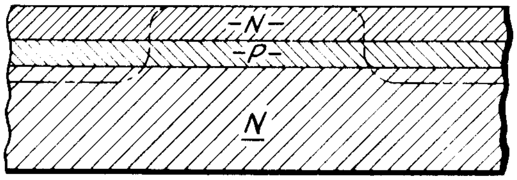
Figure 17:
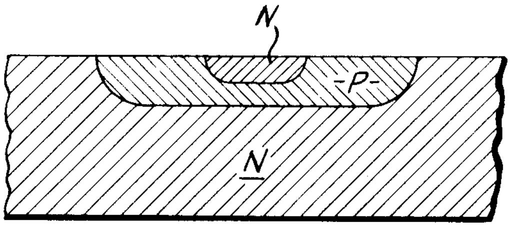
Figure 18:
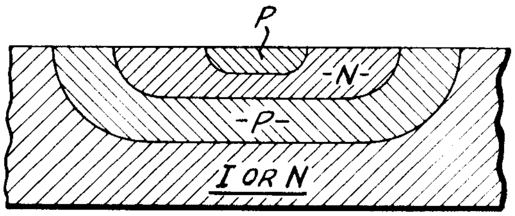
Figure 19:
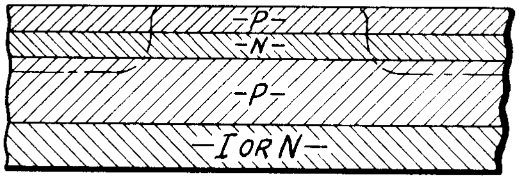
Figures 20, 21:
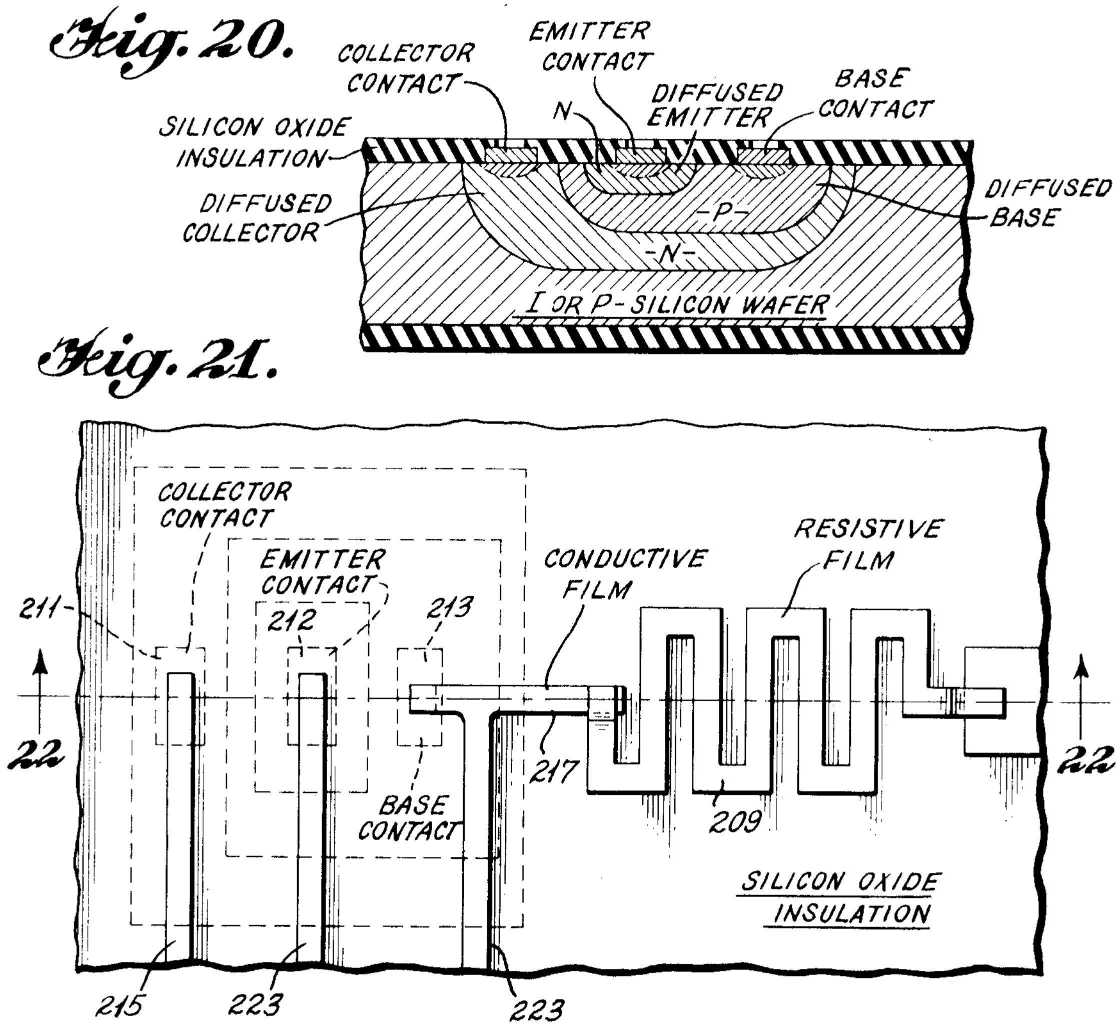
Figure 22:
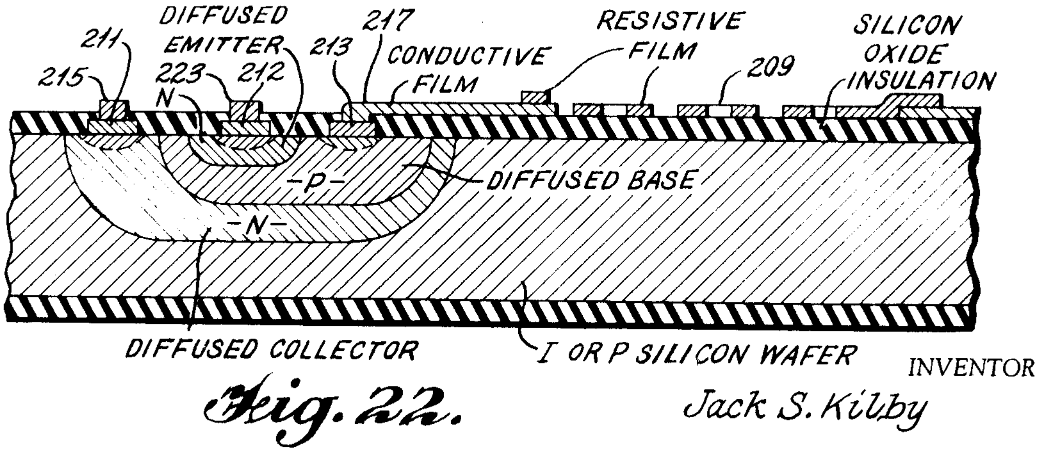
Figures 23, 25:
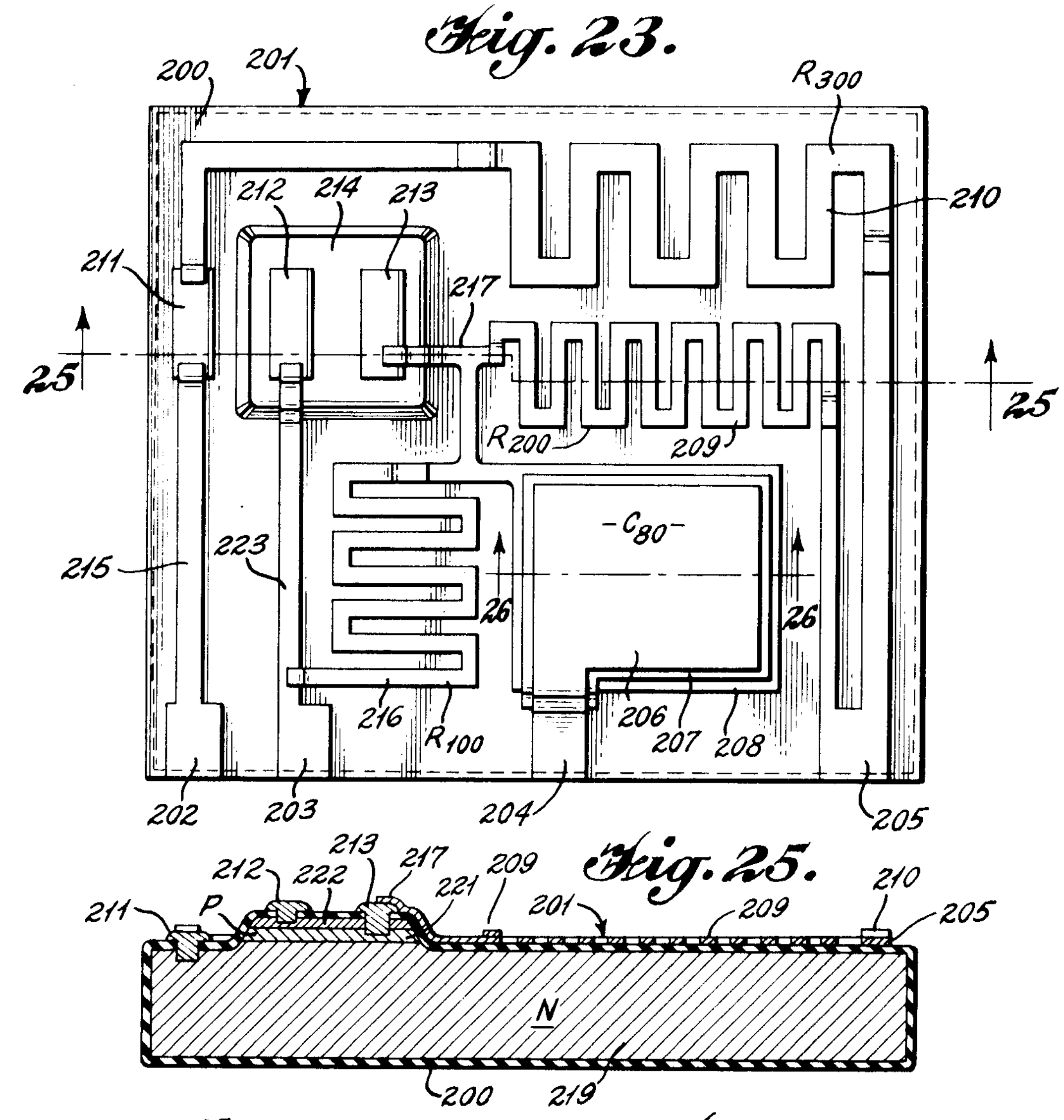
Figure 26:
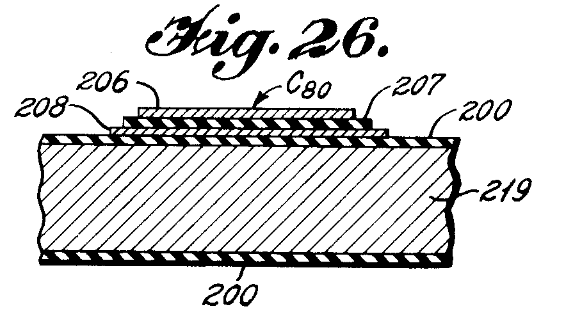
Figure 24:
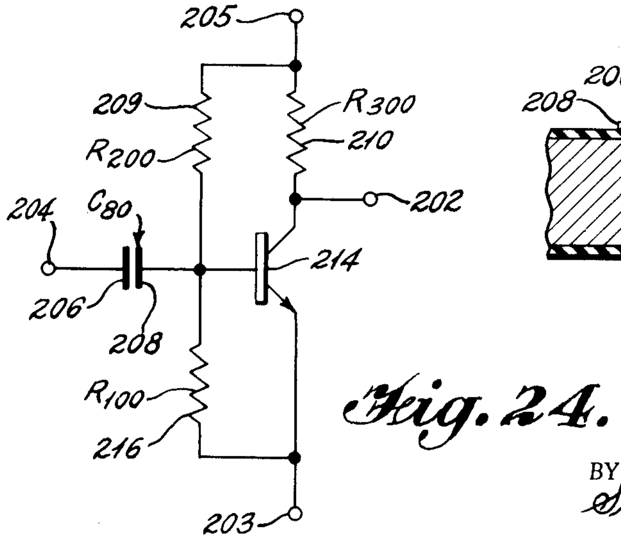

FIG. 8*a* illustrates a schematic circuit diagram of the semiconductor network illustrated in FIG. 8;

FIG. 9 is a view in plan illustrating a device similar to FIG. 8 covered by an oxide insulation and using plated lead connections;

FIG. 9*a* is a view in section taken along line 9—9 of FIG. 9;

FIGS. 10–13, inclusive, show cross-sectional views of some of the semiconductor network components illustrated in FIG. 8;

FIG. 14 is a view in section through a single crystal semiconductor wafer illustrating a fabrication technique using a single diffusion over the entire water;

FIG. 15 is a view in section through a single crystal semiconductor wafer illustrating a fabrication technique using a single diffusion into a selected area;

FIG. 16 is a view in section through a single crystal semiconductor wafer illustrating a fabrication technique using double diffusion over the entire wafer;

FIG. 17 is a view in section through a single crystal semiconductor wafer illustrating a fabrication technique using double diffusion into selected areas of the wafer;

FIG. 18 is a view in section through a single crystal semiconductor wafer illustrating a fabrication technique using triple diffusion into selected areas;

FIG. 19 is a view in section through a single crystal semiconductor wafer illustrating a fabrication technique using triple diffusion over the entire wafer;

FIG. 20 is a view in section through a single crystal semiconductor wafer illustrating a fabrication technique using triple diffusion into selected areas, oxide insulation and contact application to the diffused areas;

FIG. 21 is a view in plan illustrating s single crystal semiconductor wafer fabricated as shown in FIG. 20 and further processed with conductive and resistive films applied to the oxide insulation;

FIG. 22 is a view in section of FIG. 21 taken along lines 22—22;

FIG. 23 is a plan view illustrative of a further embodiment of the invention;

FIG. 24 is an electrical schematic diagram of the circuits physically embodied in FIG. 23;

FIG. 25 is a cross-sectional view taken along the sectional lines 25—25 of FIG. 23; and FIG. 26 is a cross-sectional view taken along the sectional lines 26—26 of FIG. 23.

Referring now to the drawings in detail, preferred embodiments of the present invention will now be described in detail in order that a better understanding of the principles of the invention and the various forms and embodiments of the invention will be better understood.

As noted previously, the invention is primarily concerned with miniaturization of electronic circuits. Also, as noted, the invention contemplates the use of a body of semiconductor material appropriately shaped, electrically and physically, and having formed therein a PN-junction or junctions and the use of component designs for the various circuit elements or components which can be integrated into or which constitute parts of the aforesaid body of semiconductor material.

Figure 1:
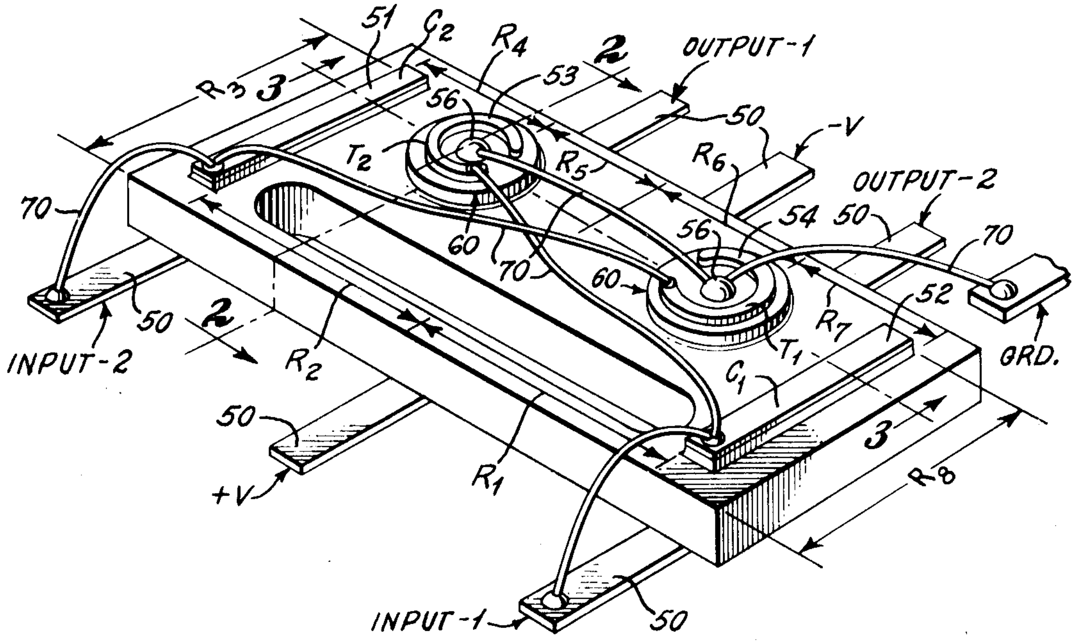
Figure 1A:
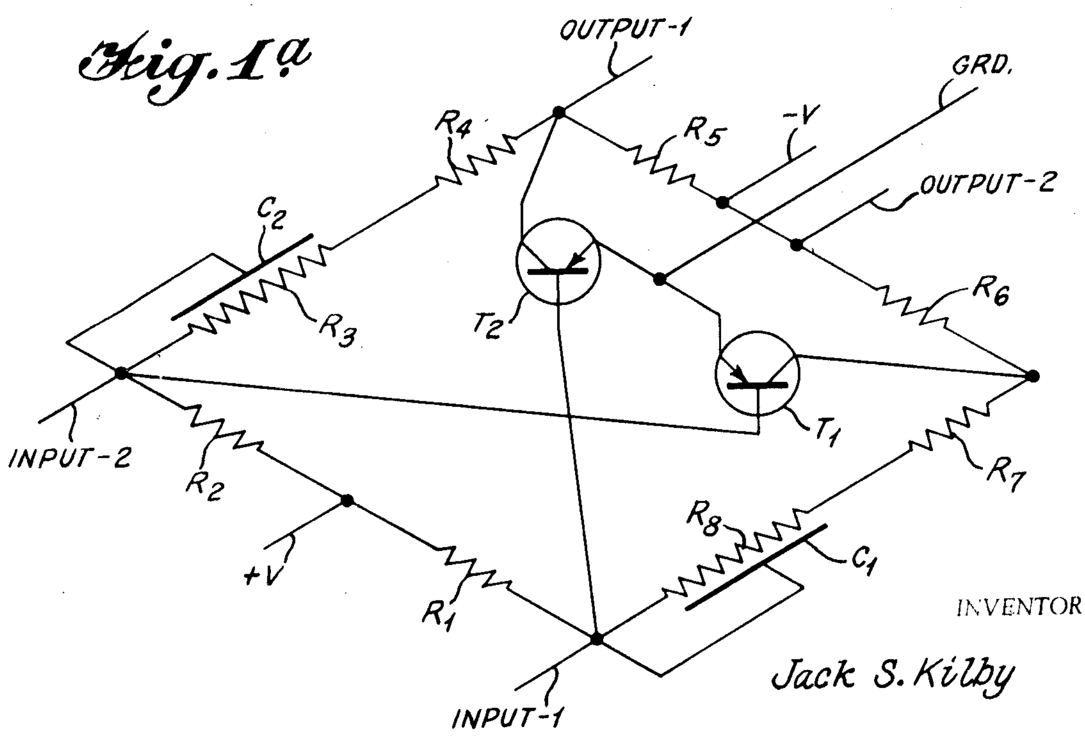
Figure 1B:
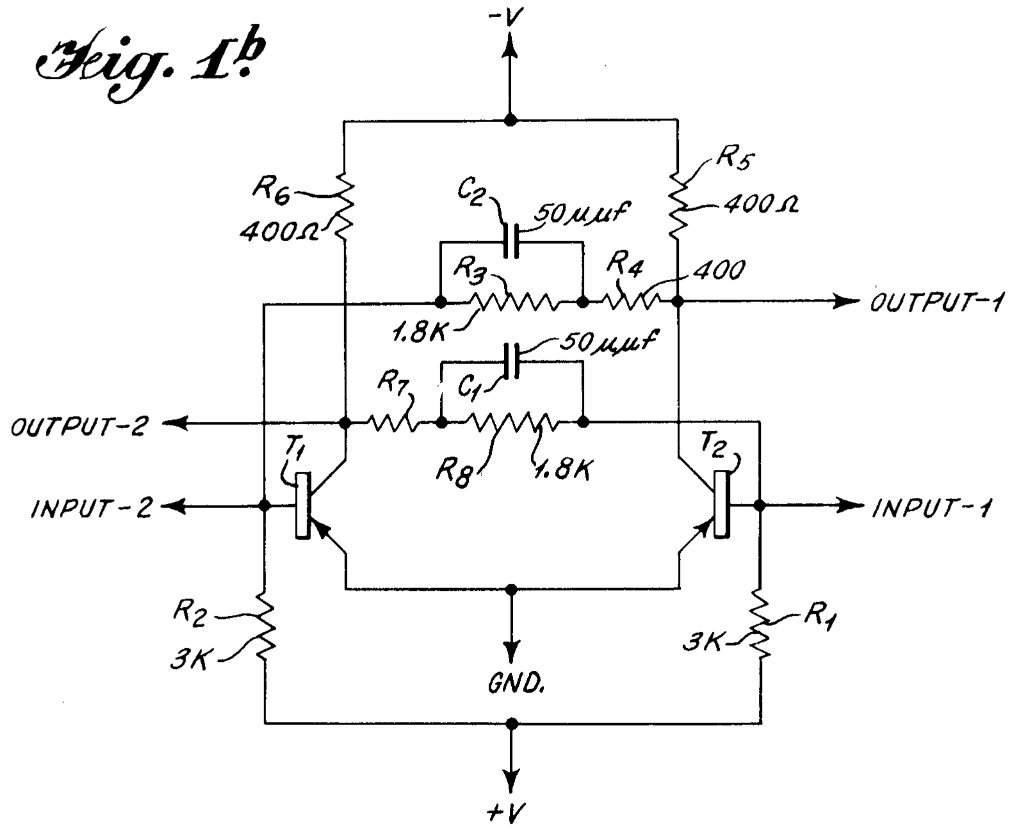

A specific illustration of an electronic circuit embodying the principles of the invention is shown in FIG. 1. As shown, a thin wafer of single crystal semiconductor material containing a diffused PN-junction has been processed and shaped to include a complete and integrated multivibrator electronic circuit formed essentially in one surface of the wafer. It is noted at this point that the body of semiconductor material is of single crystal structure, and can be composed of any suitable semiconductor material. There may be mentioned as examples of suitable materials germanium, silicon, compound semiconductors such as gallium arsenide, aluminum antimonide, indium antimonide, as well as others. The regions of the wafer have been marked with symbols representative of the circuit element functions that are performed in the various regions. FIG. 1*a* shows a schematic diagram of the various circuit functions in the relationship which they occupy in the wafer of FIG. 1. A more conventionally drawn circuit diagram is shown in FIG. 1*b* with the circuit values actually used. The multivibrator circuit shown in FIGS. 1, 1*a* and 1*b* will be described as illustrative of the processing techniques employed. First, a semiconducting wafer, preferably silicon or germanium, of the proper resistivity is lapped and polished on one side. For this design, 3 ohm-cm. P-type germanium was used. The wafer was then subjected to an antimony diffusion process which produced an N-type layer on the surface about 0.7 mils deep. The wafer was then cut to the proper size, 0.200××0.080 inches and the unpolished surface was lapped to give a wafer thickness of 0.0025 inches.

Gold-plated Kovar leads 50 were attached by alloying to the wafer in the proper positions (as shown). Kovar is a trade name for an iron-nickel-cobalt alloy. Gold was then evaporated through a mask to provide the areas 51–54 which provide ohmic contact with the *n* region, such as the transistor base connections and the capacitor contacts. Aluminum was evaporated through a properly shaped mask to provide the transistor emitter areas 56, which form rectifying contacts with the N-layer.

The wafer was then coated with a photosensitive resist or lacquer, such as Eastman Photo Resist, supplied by Eastman Kodak Company, and exposed through a negative to a light. The lacquer image remaining after development was used as a resist for etching the wafer to the proper shape. In particular, this etching forms a slot through the wafer to provide isolation between $R_1$ and $R_2$ and the rest of the circuit, and also shapes all of the resistor areas to the previously calculated configuration. Either chemical etching or electrolytic etching may be used, although electrolytic etching appears to be preferable.

After this step, the photoresist was removed with a solvent, and the mesa areas 60 masked by the same photographic process. The wafer was again immersed in etchant, and the *n* layer completely removed in the exposed areas, i.e., those areas not masked or covered by gold which is not attacked by the etchant. A chemical etch is considered preferable. The photo-resist was then removed. Gold wires 70 were then bonded to the appropriate areas to complete the connections, and a final cleanup etch given.

Instead of the capacitors shown in FIG. 1, capacitance in the body of single crystal of semiconductor material may be provided by evaporating onto the body a layer providing a dielectric layer for the capacitor. It is necessary that the layer have a suitable dielectric constant and be inert when in contact with the semiconductor body. Silicon oxide has been found to be a suitable material for the dielectric layer and may be applied by evaporation or thermal oxidation techniques onto the body. Gold plates 51 and 52 form the other plates (the semiconductor body itself constitutes one plate) of the capacitor structures and are provided by evaporating the gold onto the dielectric layers. Gold and aluminum have been found to be satisfactory materials for the other plates of the capacitor structures. Contacts are made to the plates 51 and 52 by means of gold leads 70, as noted above.

The transistors are formed on the wafer, substantially as described by Lee in "Bell System Technical Journal," Vol. 35, pg. 23 (1956). This reference describes a transistor which has a collector region, a diffused PN-junction, a base layer, an emitter contact forming a rectifying connection with base layer and base and collector contacts, respectively. The base layer is formed as a mesa of small cross section. Diodes of similar design can be made and consist of a region of one type conductivity, a mesa region of opposite conductivity type with a PN-diffused junction formed therebetween and contacts to each region.

Figure 2:
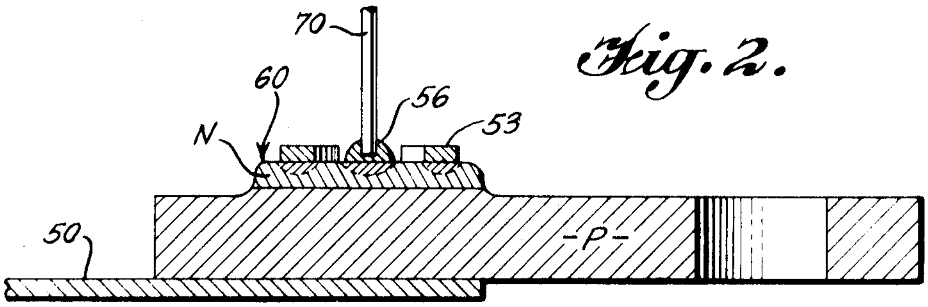
Figure 2A:
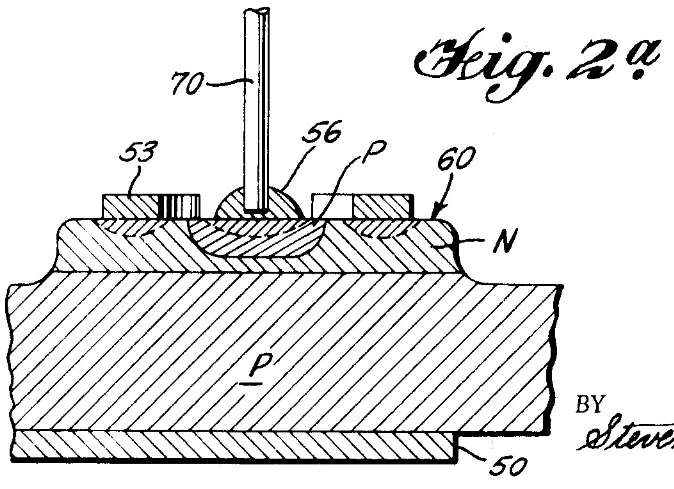
Figures 3, 3A:
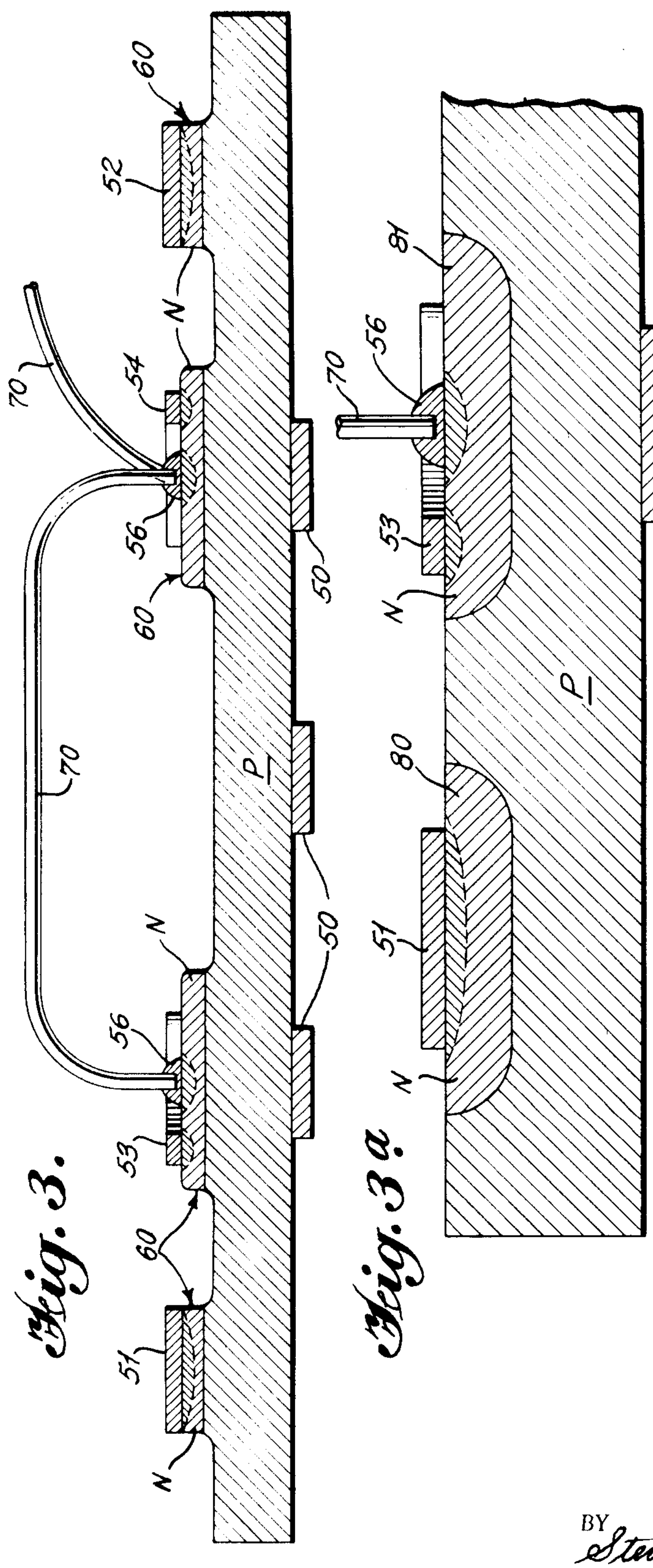
Figure 3B:
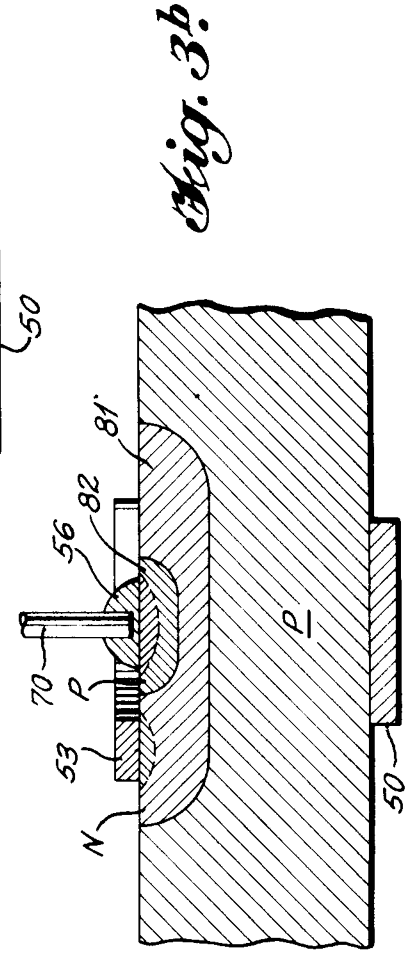

Although the transistor circuit elements have been described in terms of a single-diffused layer, it is quite possible to use a double-diffused structure. Thus, illustrated in FIG. 2*a* (an enlarged portion of a section similar to FIG. 2) is a double diffused structure wherein a P-type conductivity emitter region is diffused into the N-type conductivity base region. The contacts 56 and 53 are applied as before. As noted previously, the transistor configuration is isolated by shaping mechanically as shown in FIGS. 1, 2, 2*a* and 3 or the shaping can be accomplished by limiting the area of the component by selective conversion of semiconductor material of one conductivity type to conductivity of the opposite type wherein the PN-junction thereby formed acts as a barrier to current flow. Selective area conversion by diffusion is described by Frosch and Derick in "Journal of the Electrochemical Society," Vol. 104, pg. 547 (1957). Such selective diffusion is illustrated in FIGS. 2*a*, 3*a* and 3*b*. FIG. 3*a*, an enlarged portion of a section similar to FIG. 3, illustrates selective conversion of regions 80 and 81 to N-type conductivity by diffusion; FIG. 3*b*, an enlarged portion of a section similar to FIG. 3, illustrates selective conversion of region 82 from N-type conductivity to P-type conductivity by selective diffusion. Thus, double diffusion may be employed to form both NPN and PNP structures. Moreover, any suitable substances can be used for the semiconductor materials, conductivity-producing impurities, and contact materials; and suitable and known processing can be exploited in producing the above circuit designs.

Figure 4:
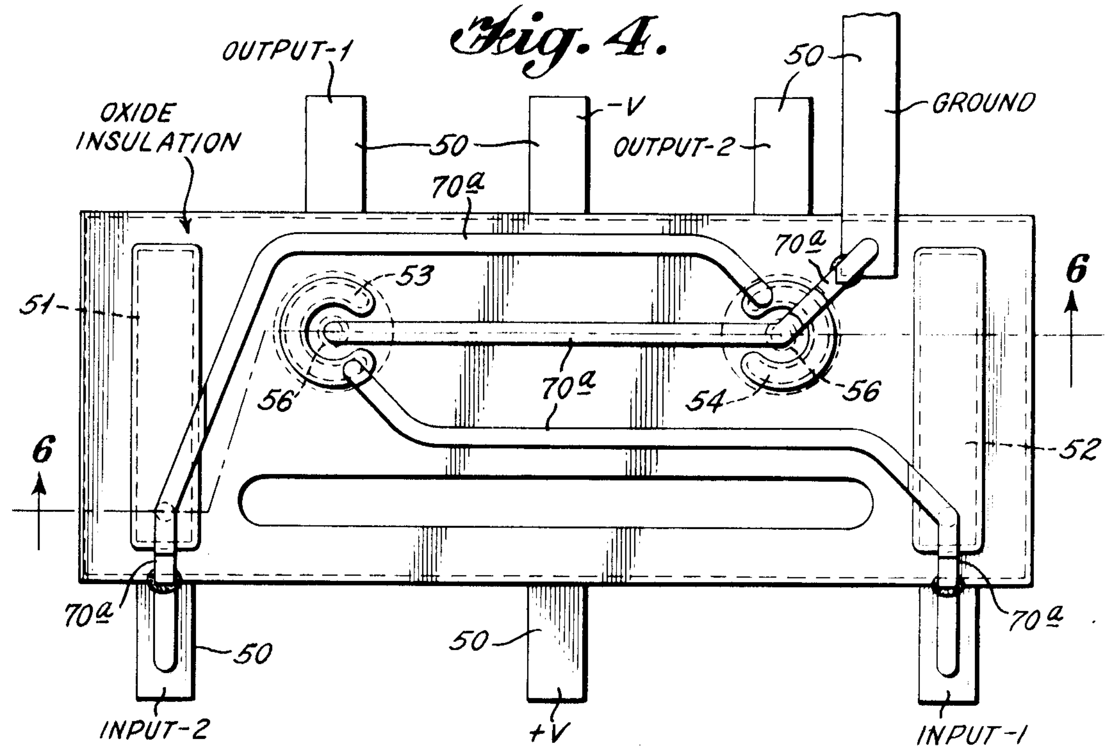
FIG. 4 is a view in plan illustrating a device similar to that of FIG. 1 covered by an oxide insulation and using plated lead connections.
Figure 5:
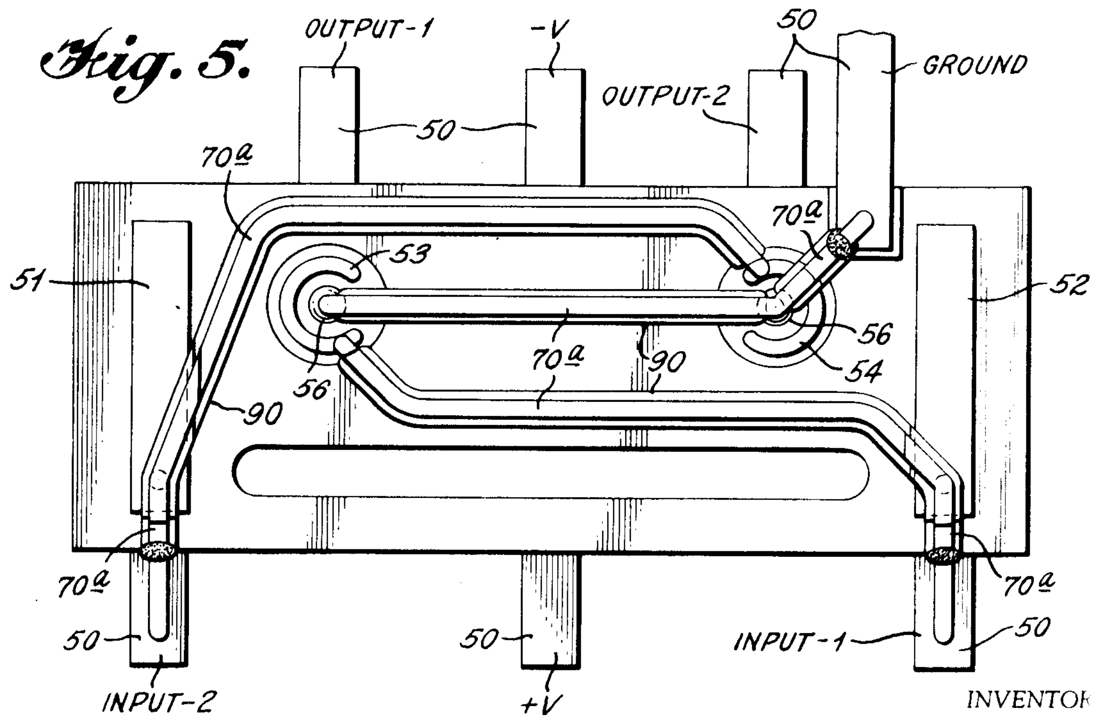
FIG. 5 is a view in plan similar to FIG. 4 showing oxide insulation underlying only the plated lead connections.

Instead of using the gold wires 70 in making electrical connections, connections may be provided in other ways. For example, an insulating and inert material such as silicon oxide may be evaporated onto the semiconductor circuit wafer through a mask either to cover the wafer completely except at the points where electrical contact is to be made thereto, or to cover only selected portions joining the points to be electrically connected. Electrically conducting material such as gold may then be laid down on the insulating material to make the necessary electrical circuit connections. These two situations are illustrated in FIGS. 4 and 5. FIG. 5 illustrates the case where the silicon oxide layers 90 adherent to the surface of the wafer are in the form of strips underlying the gold ribbons 70*a* plated thereon. As evident, the silicon oxide strips cover the selected portions fully between the points to be electrically joined by ribbons 70*a* and hence, prevent shorting of components or junctions. Thus, ribbon 70a extending from the emitter contacts 56 passes over both emitter-base and base-collector junctions, but is isolated therefrom by the silicon oxide layer 90.

Figure 6:
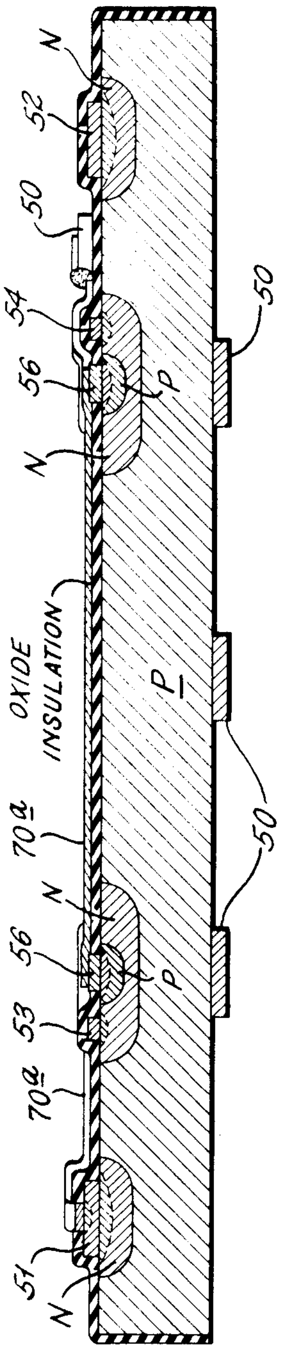
FIG. 6 is a view in section taken along line 6—6 of FIG. 4.
Figure 7:
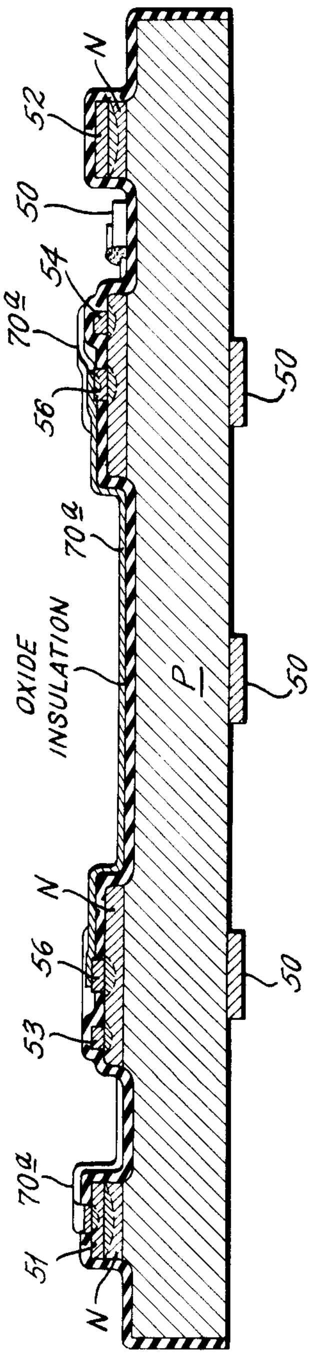
FIG. 7 is a view in section similar to FIG. 6 showing a variation.

FIGS. 4, 6 and 7 illustrate the other case, that of providing the silicon oxide layer to cover the wafer completely. As evident from FIG. 6, the component regions are formed by selective conversion, and from FIG. 7, by diffusion and mesa etching. The silicon oxide layer adheres over the entire top surface of the wafer and prevents shorting of the regions by the gold ribbons 70a plated onto and adhering to the silicon oxide layer. Note, for example, that the ribbon 70a extending from the emitter contacts 56 passes over both the emitter-base junctions and the base-collector junctions, but does not short them because it is isolated therefrom by the silicon oxide layer. The silicon oxide layer may be applied by evaporation or thermal oxidation techniques (in the case of a silicon wafer) as already noted.

After testing, the circuit may be hermetically sealed, if required, for protection against contamination. The finished device was smaller by several orders of magnitude than any others which have previously been proposed. Because the fabrication steps required are quite similar to those now used in manufacturing transistors, and because of the relatively small number of steps required, these devices are inherently inexpensive and reliable, as well as compact.

With particular reference to FIG. 8, there is shown a miniature semiconductor network which provides gated bistable multivibrator operation. Mounted on substrate 110 by solder glass are strips 112 and 114 of single crystal semiconductor material. The space 116 between these two strips was formed by originally starting with a single larger strip of semiconductor material and etching to divide the crystal into two portions. However, the purpose of this shaping operation is to provide isolation between the circuit components integrated with strips 112 and 114, and it is to be understood that substantial electrical isolation could be obtained by means other than etching completely through a larger crystal strip to form two strips; for example, electrical isolation could be provided by a high resistance area in the crystal between circuit components desired to be isolated. This high resistance will provide a substantial open circuit to prevent undesired interference between the circuit components involved. However, in the embodiment shown in FIG. 8, isolation between two portions of the multivibrator circuit is provided by etching the space 116 in an original crystal to form two crystal strips 112 and 114 which are physically separate, one from the other.

The original crystal is first completely diffused with a layer of P-type semiconductor material to form a PN-jucntion. Circuit components are then formed therein by selective etching of the semiconductor material and by selectively diffusing N-type material into the P-layer. Metal contacts may then be plated or evaporated onto desired layers to form electrical connections.

Figure 10:
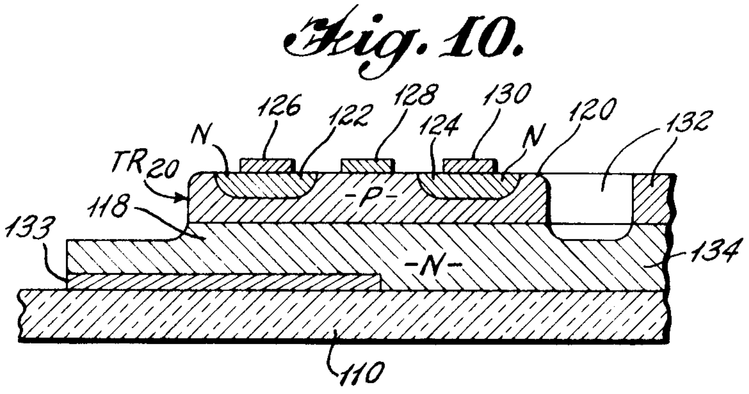

Formed in strip 112 is transistor TR–20 of the NPN-type with a second N-region diffused in the P-type base to form in effect a two-emitter transistor. A cross sectional view of TR–20 is shown in FIG. 10. This double emitter structure actually provides one NPN-transistor plus an integral diode formed by the additional selectively diffused PN-junction. TR–20 has an N-type collector region 118 provided by the crystal strip 112, P-type base region 120 and two N-type emitter regions 122 and 124. Ohmic contacts 126, 128 and 130 are plated or evaporated onto their corresponding semiconductor layers. Output lead 133 is soldered or alloyed to substrate 110, and extends beneath the left-hand end of strip 112 and makes ohmic contact therewith, and thereby also with collector region 118 of TR–20. Double emitter transistor TR–30 is identical with TR–20.

Contiguous with base 120 is a strip 132 of diffused P-type material in strip 112 and formed in a tortuous path to define a cross-coupling resistor $R_{10}$ having a value of 7 kilohms (K). The left-half 134 of crystal strip 112, a portion of which underlies P-strip 132, defines a bias resistor $R_{20}$ having a value of 5K. An ohmic contact 136 is formed on the other end of P-strip 132 to provide means for electrically connecting this end of $R_{10}$ to the output lead 138. Resistance $R_{20}$ is connected to the bias lead 140 which is mounted on substrate 110 and passes beneath strip 112 into ohmic contact therewith. P-strip 142 and its corresponding underlying and crystal portion 144 define resistors $R_{30}$ and $R_{40}$ in an identical manner. The distributed capacitance at the PN-junctions formed by P-strips 132 and 142 with their underlying corresponding N-strip portions provide a distributed capacitance equivalent to capacitors $C_{30}$ and $C_{40}$, each having a value of 1,000 micromicrofarads.

Also formed in N-strip 112 is the transistor TR–10 having a collector region defined by an area of strip 112, a diffused P-layer 145 (FIG. 8) defining a base region and a diffused N-layer 146 defining an emitter region. An ohmic contact 150 is plated on the base layer 145 so that electrical leads may be interconnected between these contacts and other elements, as described below. In cross section, TR–10 is similar to FIG. 10 with the exception that TR–10 has only one diffused emitter region instead of two. Even though TR–10 has the form of a transistor, it provides two junction diodes by means of its collector-base and emitter-base PN junctions. In this embodiment of the invention, the structure is utilized as two separate PN junction diodes $D_{10}$ and $D_{40}$ rather than to provide conventional transistor action.

Figure 13:
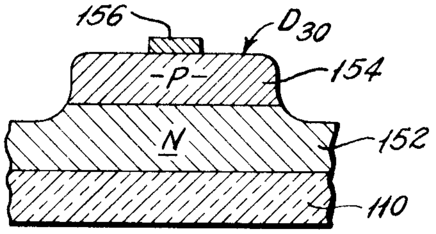

Also formed in strip 112 is a PN-junction diode $D_{30}$, a cross-sectional view of which is shown in FIG. 13. This diode is formed by a diffused PN-junction comprising the N-crystal portion 152 and the diffused P-layer 154 carrying an ohmic contact 156.

Figure 11:
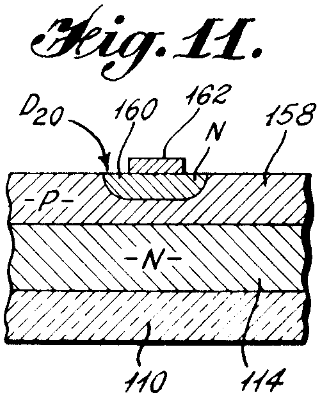

The P-layer 158 diffused into N-strip 114 is not etched away, and two N-layers are diffused into P-layer 158 to form identical junction diodes $D_{20}$ and $D_{70}$. A cross-sectional view of diode $D_{20}$ is shown in FIG. 11. In this case, the PN junction is formed between the diffused P-layer 158 and the selectively diffused N-layer 160 with the N-strip 114 merely acting as a substrate. A metal contact 162 is plated on N-layer 160 to provide means for interconnecting the junction with other circuit components or leads.

Figure 12:
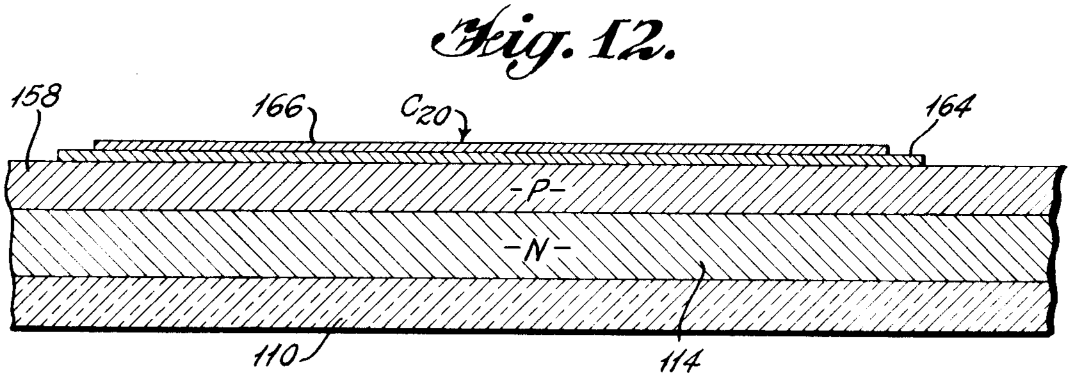

Also formed on strip 114 are two oxide-type coupling capacitors $C_{10}$ and $C_{20}$ formed as previously described and as shown in FIG. 12, oxide capacitor $C_{20}$ comprises a silicon dioxide coating 164 on P-layer 158. This coating acts as a dielectric for the capacitor $C_{20}$. A metal plate 166 is then plated on top of oxide coating 164 to complete formation of the capacitor. The capacitor is defined by the two conductors, P-layer 158 and metal plate 166, separated by the dielectric oxide coating 164.

Additional leads are attached to the substrate 110, and are utilized when this bistable multivibrator is connected as a part of a binary counter. These leads are as follows: input lead 168; clear lead 170; set lead 172; lockout lead 174; ground lead 176. External wires 180, as shown in FIG. 8, interconnect the various circuit components with each other, and with the leads in a manner to provide bistable multivibrator operation.

As in the previously described embodiments, the wires 180 of FIG. 8 may take the form of metallic strips 180a evaporated onto an insulating layer such as silicon oxide covering all of strips 112 and 114 except where it is desired to provide contacts to the various elements. Such an embodiment is shown in FIG. 9 wherein an oxide layer covers the strips 112 and 114 and acts not only as the insulator between the strips 180a and the semiconductor wafer, but also as the dielectric for capacitors $C_{10}$ and $C_{20}$. Obviously, the metallic plates 166 of the capacitors $C_{10}$ and $C_{20}$ may be laid down during the same evaporation operation applying lead strips 180a.

It may be noted from FIG. 9 that input lead 168 and ground lead 176 have been moved to avoid the necessity of providing a second oxide layer and additional evaporated strips thereon (as shown in FIG. 27) to allow crossover of certain of the leads without shorting them together. Also, of course, selective diffusion, the alternate means of shaping, may be used equally well to define the device of FIGS. 8 and 9 as illustrated by the fragmentary sectional view, FIG. 9*a*.

The gated bistable multivibrator shown in FIG. 8*a* is designed for use as one stage of a binary counter. The set input lead is utilized to determine which transistor will be initially conducting and which initially nonconducting. Since both TR–20 and TR–30 are NPN-transistors, a positive pulse on the base of transistor TR–20 will render that transistor conducting and TR–30 nonconducting. Negative trigger pulses may then be applied to the input lead through diode $D_{70}$ coupling capacitor $C_{10}$ and diode $D_{50}$ to cut off transistor TR–20 and render transistor TR–30 conducting. A second trigger pulse will return the circuit to its original condition. Selective application of pulses to the lockout lead may lock out or block trigger pulses applied to the input lead to render the multivibrator circuit insensitive to input pulses. A positive polarity pulse applied to the clear lead will return the circuit to its original condition. Output 1 and output 2 supply output pulses indicative of the state of their corresponding transistor. Therefore, FIG. 8*a* illustrates a basic gated bistable multivibrator circuit diagram which represents the operation of the semiconductor network of FIG. 8.

It must be emphasized here that only several preferred embodiments of this invention have been described above, and that other variations and modifications thereof may be made without departing from the scope of this invention, which is defined in the appended claims.

Thus, for example, since it is known that intrinsic semiconductor material is characterized by a relatively high order of resistivity, the substrate could be formed therefrom; or, the entire unit could be formed from a block of intrinsic semiconductor material into which doping impurities are diffused in the regions occupied by the cut wafers in the drawing. According to this arrangement, Item 110 of FIGS. 8 and 9 would be either a separate block of intrinsic material on which wafers 112 and 114 were mounted, or it would be part of the same physical piece of semiconductor material as areas 112 and 114, the latter differing therefrom only in electrical characteristics due to impurity doping.

Now turning to FIG. 23, it will be noted that therein is shown a semiconductor network assembly 201 which in the cross section of FIG. 25 is seen to include a block of semiconductor material 219. Formed within and upon block 219 is a transistor 214, which comprises a portion of block 219 together with layers 221 and 222 which are of conductivity types respectively opposite to and similar to the type of bock 219. These two layers 221 and 222 form the base and emitter regions respectively of the transistor, and connections are made to collector, emitter, and base regions by terminals 211, 212, and 213, respectively. Interconnecting films 215 and 223 of relatively low resistance serve to connect terminals 211 and 212 to external connection tabs 202 and 203; tab 204 provides an external connection to the upper conducting film 206 of capacitor C80; and tab 205 provides an external connection to resistive films 209 and 210, which comprise resistors R200 and R300, respectively.

As also noted from an inspection of FIG. 23, collector 211 of transistor 214 is connected to resistor film 210, and base 213 is connected via relatively low-resistance film 217 to relatively high resistance films 216 and 209 which comprise resistors R100 and R200, respectively. Relatively low-resistance film 217 also extends in the manner shown to capacitor C80, where it is enlarged to form the lower capacitor plate film 208.

Immediately over film 208 is located a dielectric film 207 which may be of any suitable material, such as silicon monoxide; and immediately above film 207 is positioned relatively low resistance film 206, which as heretofore mentioned, comprises the upper conducting film of the capacitor C80.

It will now be apparent that the circuit schematically shown in FIG. 24 is physically embodied within the structure of FIG. 23. Furthermore, it will be apparent that the embodiment of FIG. 23 includes active, as well as passive, elements, all formed on a single substrate which, in accordance with this invention, comprises a block of semiconductor material itself.

Although the methods of producing solid-state circuits according to my invention may vary somewhat, depending upon the particular embodiment involved, one illustrative method for producing the embodiment of FIG. 23 is as follows.

Initially, a block of semiconductor material is procured and doped either in its entirety or over an area in which an active circuit element is to be formed. Such doping may be accomplished by any one of several processes, but the one selected for this illustrative description is that of diffusion. Thus, impurities may be diffused in successive layers into the surface of the semiconductor block to form emitter, base, and collector regions. FIGS. 14, 16 and 19 illustrate single, double and triple diffusion into an N-type or I-type semiconductor wafer over its entire surface and FIGS. 15, 17 and 18 illustrate single, double and triple diffusion into selected areas of an N-type or I-type semiconductor wafer to form the structure here disclosed.

After doping has been accomplished, upper layer areas other than those required for the active circuit elements may be eliminated by etching, as indicated by the dotted lines in FIGS. 14, 16 and 19, thereby leaving only those desired. Subsequently, the entire remaining block of material may be covered by an insulating coating 219, ohmic connections made to the several regions of the transistor or other active element, passive elements formed on the surface of the insulating coating, and terminals formed to provide means for making external connections.

Now considering the application of this process to the illustration of FIGS. 20–23, 25 and 26, it will be seen that the layers 221 and 222 of transistor 214 in FIGS. 23 and 25 extend upwardly from block 219, for this structure contemplates the initial doping of two successive layers over the entire surface of the semiconductor block or wafer and the etching for removal of the top two layers from all of the block or wafer surface except in the relatively small area shown. As is well known in the art, such etching may be accomplished by temporarily coating the semiconductor block with a protective substance in the area desired not be etched, and then immersing or spraying the block with a suitable etching substance, such as CP–4, described at page 354, Vol. I, of *Transistor Technology*, edited by Bridgers, Scaff, and Shive, published by Van Nostrand Company, New York.

The next step in fabrication of the electronic package consists of coating the entire member with an insulating layer 200, either by evaporation or thermal oxidation in the case of silicon as previously described. Although the areas particularly desired to be coated are those upon which the heretoforementioned resistive and conducting films are to be deposited, the coating has been shown in the Figures to cover the entire member, since it may be easier thus to apply it. After the insulating layer has been deposited, small apertures are etched therethrough at the emitter, base, and collector electrodes 212, 213, and 211 in FIGS. 23 and 25 in order that connection may be made thereto. This structure is shown in greater detail in the enlarged section of FIG. 20 illustrating a triple-diffused silicon wafer with a silicon oxide insulation and emitter, base and collector contacts applied through aperture in the oxide layer. These small apertures may be formed in any one of the variety of ways well known in the art. However, one illustrative manner in which this may be accomplished contemplates the coating of the entire top surface of the wafer with a photo-resist compound which may then be exposed to light through a mask having opaque areas immediately adjacent the areas in which it is desired to form the aforementioned apertures and developed. The assembly may then be washed to remove the photo-resist material from those unexposed areas atop the emitter, base, and collector regions, and the assembly may then be brought into contact with an etching solution which is effective to etch through the insulating coating to form recesses of the desired depth. After this has been accomplished, the photo-resist material is removed by immersion in methylene chloride.

Next, the assembly is mechanically masked over its entire surface except where the recesses have been etched, and suitable ohmic-contact-making material is evaporated or otherwise deposited therein, as illustrated in FIGS. 20–23. Thus, for example, if an NPN-type transistor is being formed, a mask might be used to cover all of the surface except the emitter and collector recesses, and antimony-doped gold or other suitable material could be evaporated or otherwise deposited through the mask into the recesses. Thereafter, the entire surface of the wafer could be masked except for the base recess, into which a suitable ohmic-contact-making material such as aluminum might be evaporated or otherwise deposited. After this has been accomplished, the entire assembly is heated to a predetermined temperature at which the deposited material alloys with the base, emitter, and collector to form severally distinct ohmic contacts therewith. Since the principles of alloying ohmic contacts to semiconductor devices are well known in the art, no further description of details thereof will be given here.

After the aforementioned ohmic contacts have been made, either the resistive films or the highly conductive films can be next applied. Assuming, for the purposes of this description, that highly conductive films are next applied, a mask is fitted over the surface of the wafer to expose only those areas upon which it is desired to deposit highly conductive films. Next, any suitable highly conductive material, such as copper or gold, is applied by vacuum deposition technique such as that described in the book, *Vacuum Deposition of Thin Films*, by Holland, Holland, published by John Wiley & Sons, New York, 1958. A relatively thick film is applied to the indicated areas in order that the resistance thereof may be made low (see FIGS. 21 and 23).

After the low-resistance films have been applied, the surface is exposed through a different mask to permit deposition of a relatively thin film of highly resistive materials, such as nichrome, to the areas desired (see FIGS. 21 and 23).

Next, the entire surface may be covered with a material which serves both as a dielectric for capacitor C80 and as a coating to protect the metal films from oxidation and deterioration. This dielectric film is shown in FIG. 23 as covering only the area identified with the symbol 207 in order that the Figure may be more readily understood. Of course, if it were desired to coat only the area indicated by numeral 207, a mask having a rectangular aperture in the position of rectangle 207 could be employed to prevent deposit other than in this area.

After the dielectric has been deposited, the area indicated by the symbols 204 and 206 of FIG. 23 is coated with a highly conductive film similar to that employed for film 208, and the capacitor is thereby completed.

It will now be seen that the members depicted in FIGS. 21–23, 25 and 26 have been formed in such manner that both active and passive elements are provided in one physically integrated member of extremely small size. The insulating layer covers and adheres to the entire surface of the wafer and in particular the junction edges exposed at the surface preventing shorting by the metal films which pass over the junction edges but are isolated therefrom by the insulating layer.

It will also be apparent that the various principles disclosed herein could be advantageous combined to produce structures exhibiting the advantages and features of several principles. Thus, for example, the active semiconductor elements, the noncritical resistance elements, and the distributed capacitance elements could be formed in the manner described with reference to FIGS. 1–13, and high stability resistors, capacitors, and inductors formed in the manner described with reference to FIGS. 20–26. Connections therebetween could be made by etching apertures through the insulating coating at the desired points and the depositing of suitable ohmic-contact-making material to provide connections as described above.

Although the particular illustrative embodiments have been described in this specification, it will be quite obvious to one skilled in the art that various modifications and changes are possible as well as various other combinations. Accordingly, such changes as will appear obvious to one skilled in this art from a knowledge of my teachings are deemed to come within the purview of my invention.

What is claimed is:

1. A semiconductor device comprising:

a. a wafer of semiconductor material having two major faces;

b. said wafer being so shaped as to define a plurality of regions within said wafer and adjacent to one of said major faces;

c. at least some of said regions being electrically isolated within said wafer from others of said regions;

d. said regions having at least one portion thereof extending to said one major face;

e. at least some of said portions having selected locations on said one major face for electrical contact to said region;

f. an insulating material on said one major face of the wafer excluding at least said selected locations;

g. at least one electrically conductive area in contact with said insulating material and spaced from said wafer thereby;

h. said electrically conductive area being disposed in cooperative relationship with respect to a selected one of said isolated regions so as to provide the electrical function of a discrete electrical circuit component; and i. a plurality of metallic interconnections providing electrically conductive paths between said selected locations on different ones of said regions and between another selected one of said locations and said electrically conductive area.

2. A semiconductor device comprising:

a. a wafer of semiconductor material having two major faces;

b. said wafer being so shaped as to define a plurality of regions within said wafer and adjacent to one of said major faces;

c. at least some of said regions being electrically isolated within said wafer from others of said regions;

d. said regions having at least one portion thereof extending to said one major face;

e. said portions having selected locations on said one major face for electrical contact to said region;

f. an insulating material on said one major face of the wafer excluding at least said selected locations;

g. at least one electrically conductive area in contact with said insulating material and spaced from said wafer thereby;

h. said electrically conductive area being disposed in cooperative relationship with respect to a selected one of said isolated regions so as to provide the electrical function of a discrete electrical circuit component; and i. a plurality of metallic interconnections providing electrically conductive paths on said insulating material on said major face between said selected locations on different ones of said regions and between another selected one of said locations and said electrically conductive area.

3. A semiconductor device as defined in claim 2 wherein said wafer is single crystal semiconductor material.

4. A semiconductor device as defined in claim 2 wherein said insulating material comprises an oxide of silicon.

* * * * *